US010446530B2

(12) United States Patent
Mortensen et al.

(10) Patent No.: US 10,446,530 B2
(45) Date of Patent: Oct. 15, 2019

(54) OFFSET INTERPOSERS FOR LARGE-BOTTOM PACKAGES AND LARGE-DIE PACKAGE-ON-PACKAGE STRUCTURES

(75) Inventors: Russell K. Mortensen, Chandler, AZ (US); Robert M. Nickerson, Chandler, AZ (US); Nicholas R. Watts, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 166 days.

(21) Appl. No.: 13/977,101

(22) PCT Filed: Aug. 16, 2011

(86) PCT No.: PCT/US2011/047948
§ 371 (c)(1),
(2), (4) Date: Jun. 28, 2013

(87) PCT Pub. No.: WO2013/025205
PCT Pub. Date: Feb. 21, 2013

(65) Prior Publication Data
US 2013/0271907 A1    Oct. 17, 2013

(51) Int. Cl.
*H05K 1/11* (2006.01)
*H05K 3/40* (2006.01)
(Continued)

(52) U.S. Cl.
CPC .......... *H01L 25/18* (2013.01); *H01L 21/4846* (2013.01); *H01L 23/49816* (2013.01);
(Continued)

(58) Field of Classification Search
CPC ................. H05K 1/113; H05K 3/4038; H01L 23/49833; H01L 25/105
(Continued)

(56) References Cited

U.S. PATENT DOCUMENTS 6,618,267 B1 *  9/2003  Dalal .................. H01L 23/5385
                                                                257/E23.114
6,906,415 B2    6/2005  Jiang et al.
(Continued)

FOREIGN PATENT DOCUMENTS

CN    1532930 A    9/2004
CN    1532931 A    9/2004
(Continued)

OTHER PUBLICATIONS

International Search Report and Written Opinion received for International Application No. PCT/US2011/047948, dated Apr. 9, 2012, 8 pages.
(Continued)

*Primary Examiner* — Bernard Rojas
(74) *Attorney, Agent, or Firm* — Schwegman Lundberg & Woessner, P.A.

(57) ABSTRACT

An offset interposer includes a land side including land-side ball-grid array (BGA) and a package-on-package (POP) side including a POP-side BGA. The land-side BGA includes two adjacent, spaced-apart land-side pads, and the POP-side BGA includes two adjacent, spaced-apart POP-side pads that are coupled to the respective two land-side BGA pads through the offset interposer. The land-side BGA is configured to interface with a first-level interconnect. The POP-side BGA is configured to interface with a POP substrate. Each of the two land-side pads has a different footprint than the respective two POP-side pads.

24 Claims, 9 Drawing Sheets

(51) Int. Cl.

| | | |
|---|---|---|
| *H01L 25/18* | (2006.01) | |
| *H01L 23/498* | (2006.01) | |
| *H01L 23/00* | (2006.01) | |
| *H01L 25/10* | (2006.01) | |
| *H01L 21/48* | (2006.01) | |
| *H01L 25/00* | (2006.01) | |
| *H01L 25/065* | (2006.01) | |

(52) U.S. Cl.
CPC .. *H01L 23/49827* (2013.01); *H01L 23/49833* (2013.01); *H01L 23/49838* (2013.01); *H01L 24/03* (2013.01); *H01L 24/09* (2013.01); *H01L 24/11* (2013.01); *H01L 24/17* (2013.01); *H01L 24/43* (2013.01); *H01L 24/49* (2013.01); *H01L 24/73* (2013.01); *H01L 24/81* (2013.01); *H01L 24/85* (2013.01); *H01L 24/89* (2013.01); *H01L 25/0657* (2013.01); *H01L 25/105* (2013.01); *H01L 25/50* (2013.01); *H05K 1/113* (2013.01); *H05K 3/4038* (2013.01); *H01L 24/16* (2013.01); *H01L 24/32* (2013.01); *H01L 24/48* (2013.01); *H01L 2224/0401* (2013.01); *H01L 2224/0557* (2013.01); *H01L 2224/08238* (2013.01); *H01L 2224/13025* (2013.01); *H01L 2224/16146* (2013.01); *H01L 2224/16225* (2013.01); *H01L 2224/16227* (2013.01); *H01L 2224/16238* (2013.01); *H01L 2224/32145* (2013.01); *H01L 2224/32225* (2013.01); *H01L 2224/48091* (2013.01); *H01L 2224/48106* (2013.01); *H01L 2224/48227* (2013.01); *H01L 2224/48245* (2013.01); *H01L 2224/48472* (2013.01); *H01L 2224/73204* (2013.01); *H01L 2224/73257* (2013.01); *H01L 2224/73265* (2013.01); *H01L 2225/0651* (2013.01); *H01L 2225/0652* (2013.01); *H01L 2225/06517* (2013.01); *H01L 2225/06572* (2013.01); *H01L 2225/107* (2013.01); *H01L 2225/1023* (2013.01); *H01L 2225/1058* (2013.01); *H01L 2924/00014* (2013.01); *H01L 2924/143* (2013.01); *H01L 2924/1432* (2013.01); *H01L 2924/1434* (2013.01); *H01L 2924/1436* (2013.01); *H01L 2924/1437* (2013.01); *H01L 2924/1511* (2013.01); *H01L 2924/15311* (2013.01); *H01L 2924/15321* (2013.01); *H01L 2924/15331* (2013.01); *H01L 2924/381* (2013.01); *Y10T 29/49124* (2015.01)

(58) Field of Classification Search
USPC .......................... 361/679.02, 742, 760, 767
See application file for complete search history.

(56) References Cited

U.S. PATENT DOCUMENTS

| | | | |
|---|---|---|---|
| 6,952,049 B1 | 10/2005 | Ogawa et al. | |
| 7,566,961 B2 | 7/2009 | Cho | |
| 7,755,181 B2 | 7/2010 | Han et al. | |
| 8,169,059 B2* | 5/2012 | Barth | H01L 21/76898 257/508 |
| 8,513,792 B2 | 8/2013 | Ganesan et al. | |
| 8,723,302 B2* | 5/2014 | Chandra | H01L 23/5385 257/686 |
| 8,836,136 B2* | 9/2014 | Chau | H01L 23/49517 257/774 |
| 8,987,896 B2 | 3/2015 | Cheah et al. | |
| 2001/0013654 A1 | 8/2001 | Kalidas et al. | |
| 2001/0036711 A1 | 11/2001 | Urushima | |
| 2002/0132463 A1 | 9/2002 | Urushima | |
| 2003/0230801 A1 | 12/2003 | Jiang et al. | |
| 2004/0106229 A1 | 6/2004 | Jiang et al. | |
| 2004/0184219 A1 | 9/2004 | Otsuka et al. | |
| 2005/0218518 A1 | 10/2005 | Jiang et al. | |
| 2006/0175695 A1 | 8/2006 | Lee | |
| 2007/0075726 A1 | 4/2007 | Chan et al. | |
| 2008/0157326 A1 | 7/2008 | Han et al. | |
| 2008/0308950 A1* | 12/2008 | Yoo | H01L 25/105 257/778 |
| 2009/0166834 A1 | 7/2009 | Yoon et al. | |
| 2009/0166886 A1 | 7/2009 | Kim et al. | |
| 2010/0140771 A1 | 6/2010 | Rui et al. | |
| 2010/0258927 A1 | 10/2010 | Ganesan et al. | |
| 2010/0285637 A1 | 11/2010 | Khan et al. | |
| 2010/0327419 A1 | 12/2010 | Muthukumar et al. | |
| 2011/0140268 A1 | 6/2011 | Cheah et al. | |
| 2012/0153445 A1* | 6/2012 | Son | H01L 23/3128 257/668 |
| 2012/0159118 A1 | 6/2012 | Wong et al. | |
| 2013/0168841 A1* | 7/2013 | Zhao | H05K 1/029 257/676 |
| 2015/0355232 A1* | 12/2015 | Whetsel | B05C 21/00 324/756.05 |
| 2016/0218093 A1 | 7/2016 | Mortensen et al. | |

FOREIGN PATENT DOCUMENTS

| | | |
|---|---|---|
| CN | 103748678 | 4/2014 |
| CN | 103748678 B | 9/2016 |
| EP | 1041631 | 10/2000 |
| EP | 2745317 | 6/2014 |
| JP | 2010010288 A | 1/2010 |
| KR | 20090071381 A | 7/2009 |
| KR | 20140054143 | 5/2014 |
| KR | 101808478 B1 | 12/2017 |
| TW | 200939362 A | 9/2009 |
| WO | 20131025205 A1 | 2/2013 |

OTHER PUBLICATIONS

International Preliminary Report on Patentability received for PCT Patent Application No. PCT/US2011/047948, dated Feb. 27, 2014, 4 pages.
Extended European Search Report received for European Patent Application No. 11871050.8 dated Jul. 15, 2015, 7 pages of Extended Search Report.
Office Action Received for Korean Patent Application No. 10-2014-7005161 dated Sep. 4, 2015, 9 pages of Office Action and 9 pages of English Translation.
Office Action Received for Chinese Patent Application No. 201180072839.0 dated Dec. 2, 2015, 11 pages of Office Action and 18 pages of English Translation.
"Chinese Application Serial No. 201180072839.0, Response filed Mar. 29, 2016 to Office Action dated Dec. 2, 2015", W/ English Claims, 30 pgs.
"European Application Serial No. 11871050.8, Response filed Feb. 10, 2016 to Extended European Search Report dated Jul. 15, 2015", 10 pgs.
"Korean Application Serial No. 10-2014-7005161, Office Action dated Mar. 17, 2016", W/ English Translation, 6 pgs.
"Korean Application Serial No. 10-2014-7005161, Response filed Jun. 2, 2016 to Office Action dated Mar. 17, 2016", W/ English Translation of Claims, 16 pgs.
"Korean Application Serial No. 10-2016-7032944, Office Action dated Mar. 1, 2017", W/ English Translation, 10 pgs.
"U.S. Appl. No. 14/757,913, Non Final Office Action dated Aug. 8, 2018", 12 pgs.
"U.S. Appl. No. 14/757,913, Response filed Jul. 9, 2018 to Restriction Requirement dated May 7, 2018", 7 pgs.
"U.S. Appl. No. 14/757,913, Restriction Requirement dated May 7, 2018", 8 pgs.
"U.S. Appl. No. 15/087,153, Non Final Office Action dated May 23, 2018", 12 pgs.
"Korean Application Serial No. 10-2016-7032944, Response filed Apr. 28, 2017 to Office Action dated Mar. 1, 2017", w/English Claims, 16 pgs.

(56) References Cited

OTHER PUBLICATIONS

"U.S. Appl. No. 14/757,913, Final Office Action dated Dec. 27, 2018", 10 pgs.

"U.S. Appl. No. 14/757,913, Response filed Dec. 10, 2018 to Non Final Office Action dated Aug. 8, 2018", 12 pgs.

"U.S. Appl. No. 15/087,153, Non Final Office Action dated Jan. 14, 2019", 10 pgs.

"U.S. Appl. No. 15/087,153, Response filed Aug. 23, 2018 to Non Final Office Action dated May 23, 2018", 9 pgs.

"U.S. Appl. No. 15/087,153, Response filed Nov. 21, 2018 to Non Final Office Action dated Sep. 21, 2018", 9 pgs.

"European Application Serial No. 11871050.8, Communication Pursuant to Article 94(3) EPC dated Mar. 20, 2019", 5 pgs.

"U.S. Appl. No. 15/087,153, Response filed Jun. 14, 2019 to Non Final Office Action dated Jan. 14, 2019", 9 pgs.

"U.S. Appl. No. 15/087,153, Notice of Allowance dated Jul. 3, 2019", 8 pgs.

"European Application Serial No. 11871050.8, Response filed Jul. 22, 2019 to Communication Pursuant to Article 94(3) EPC dated Mar. 20, 2019", 8 pgs.

\* cited by examiner

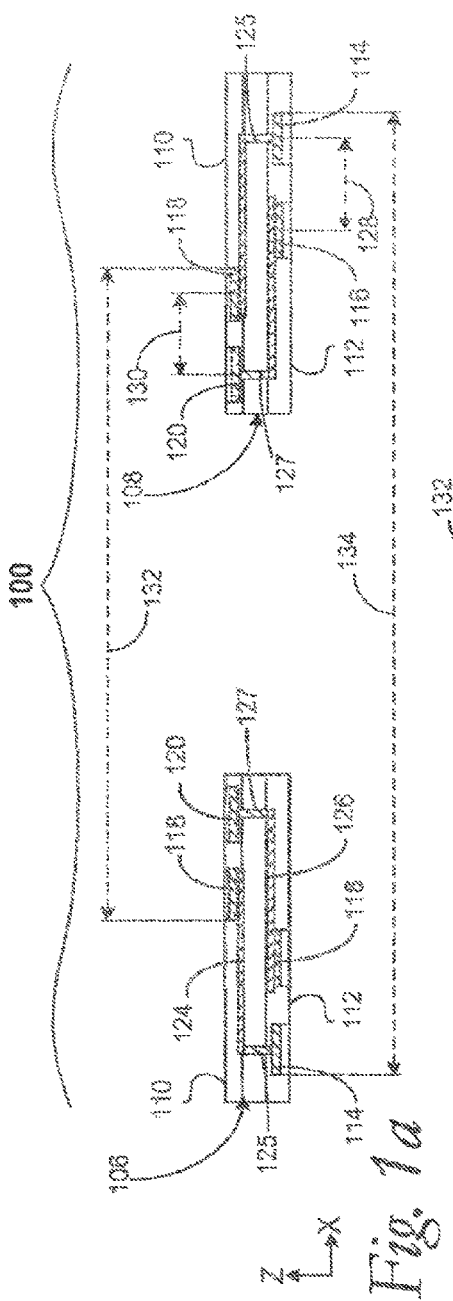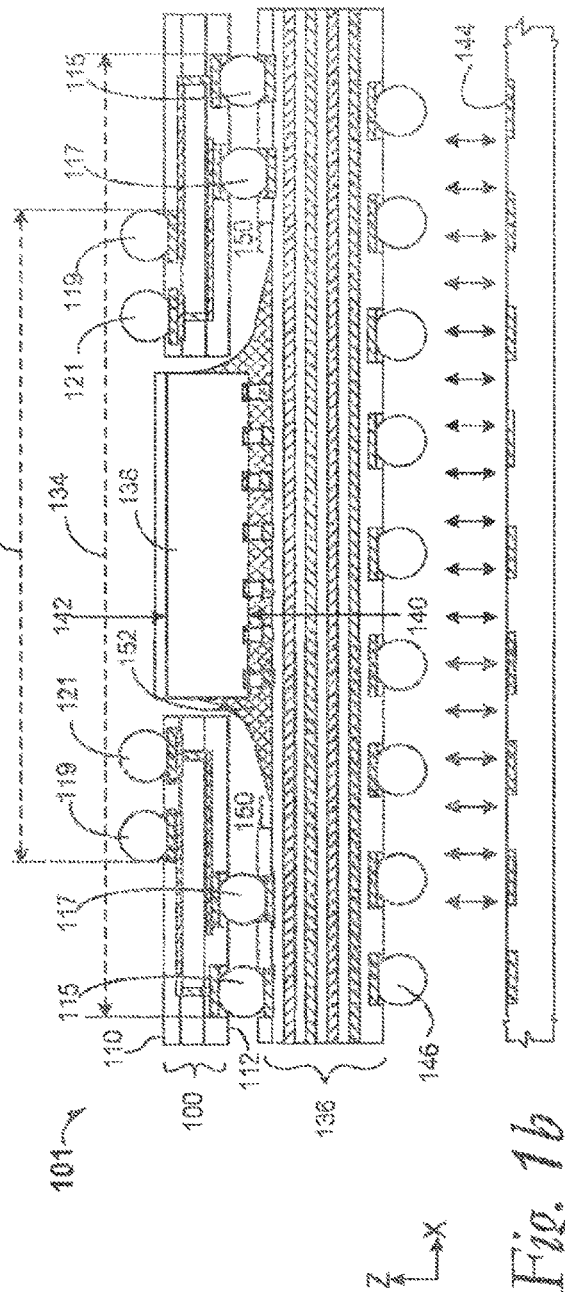
Fig. 1a
Fig. 1b

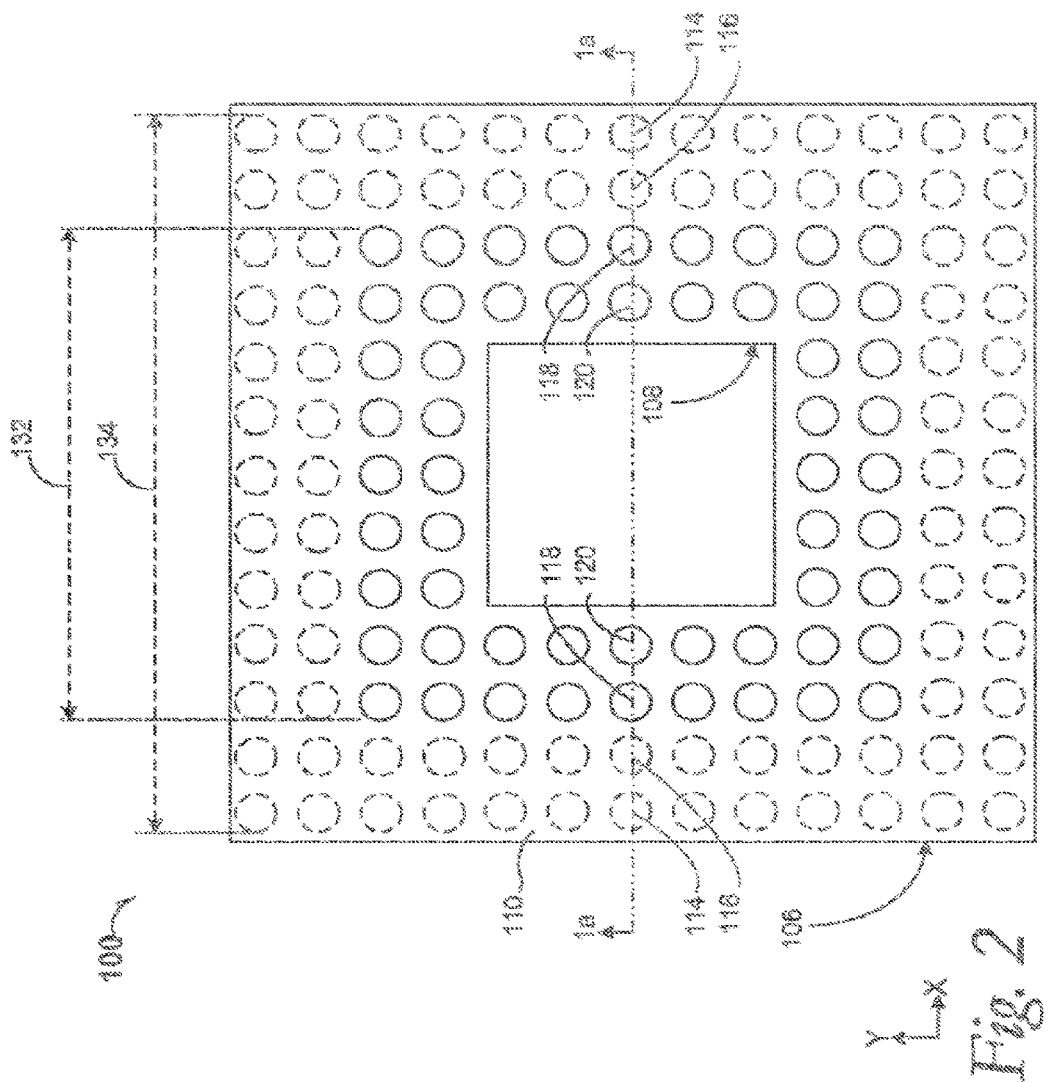

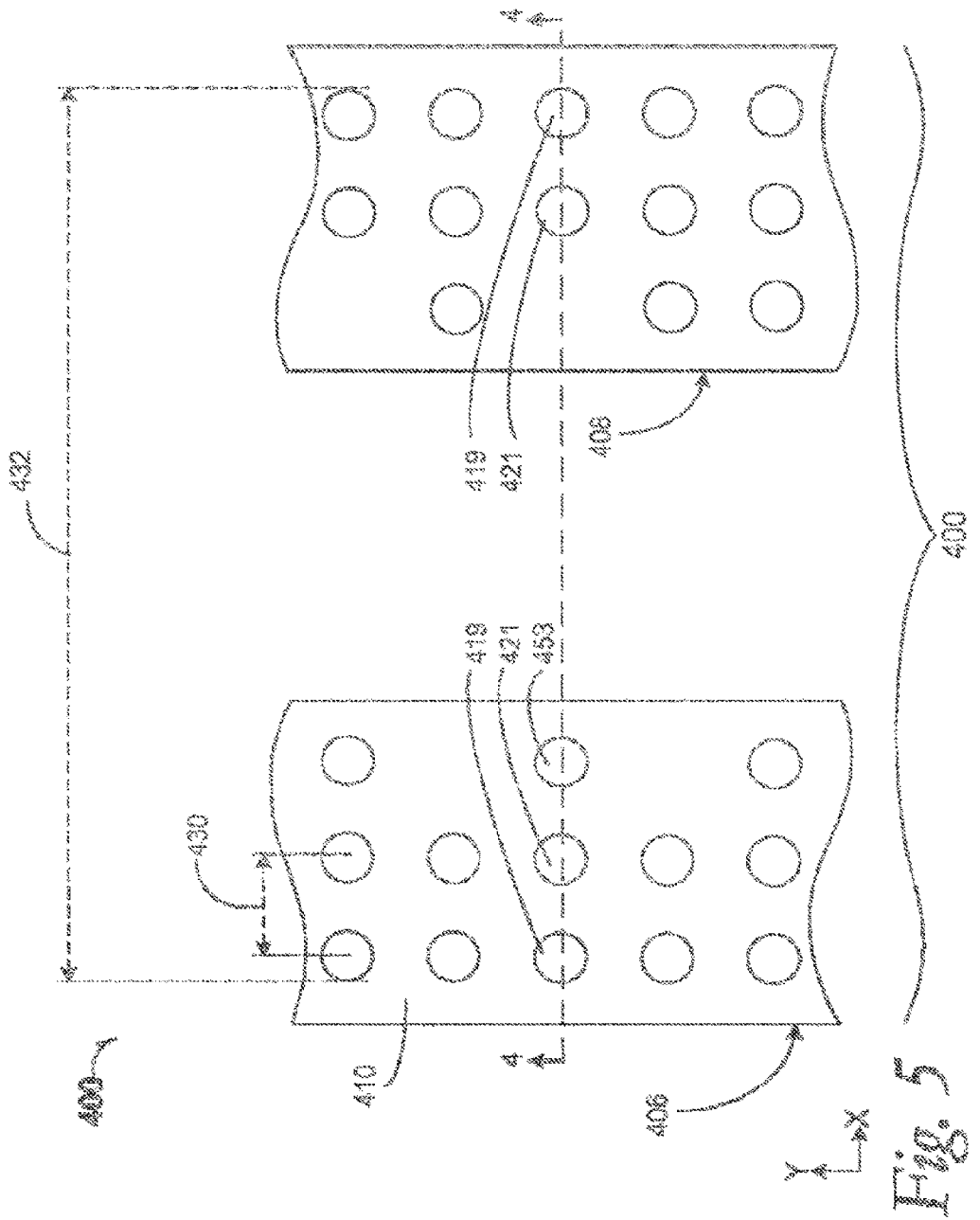

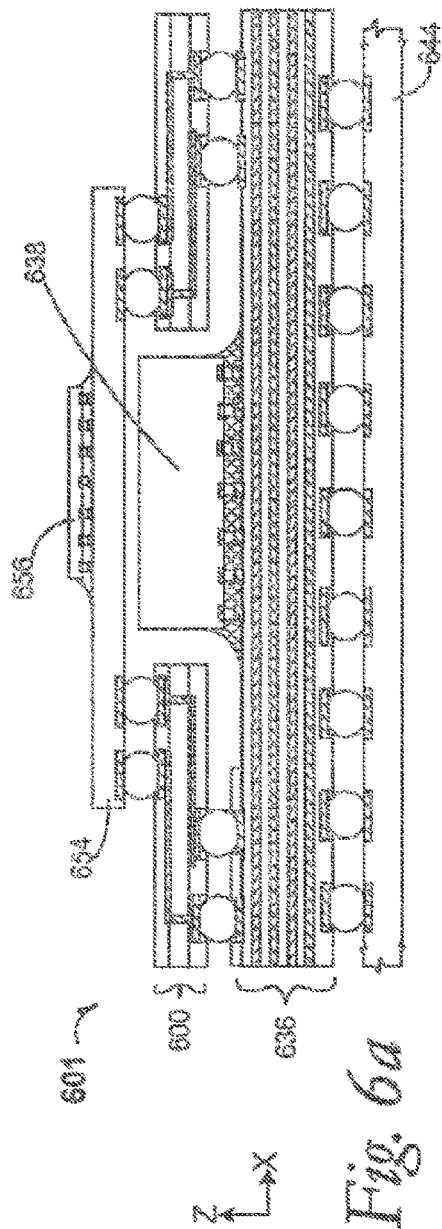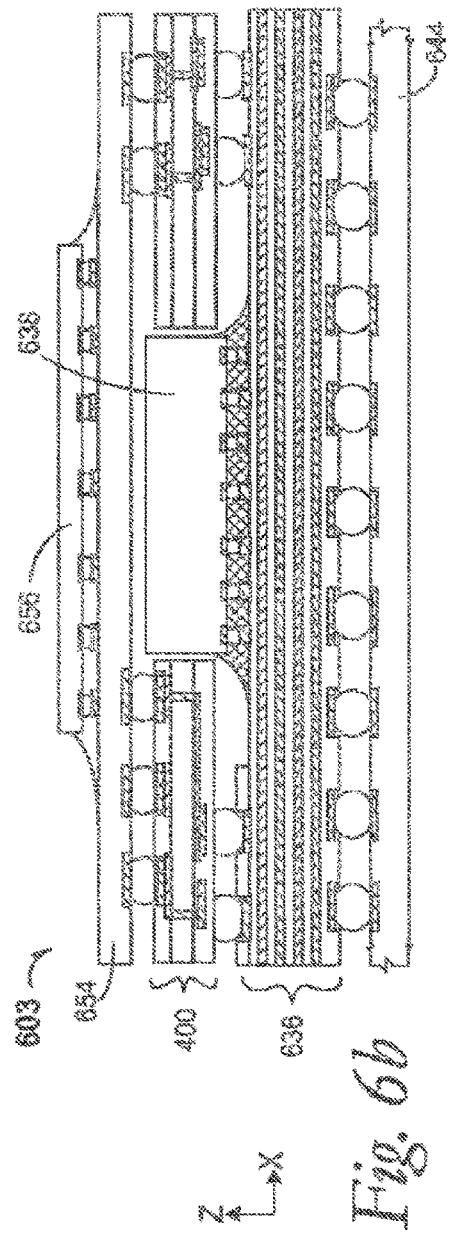

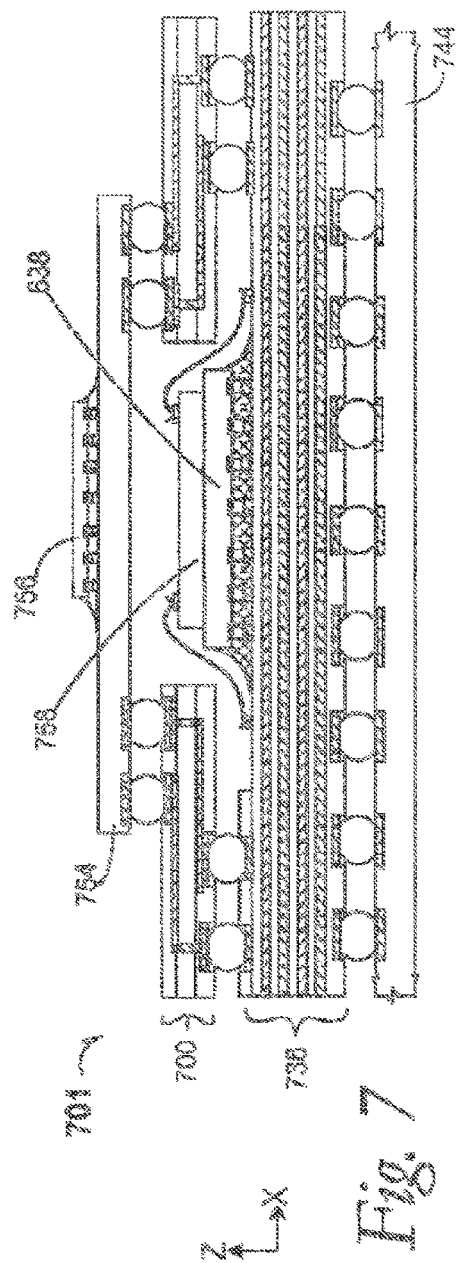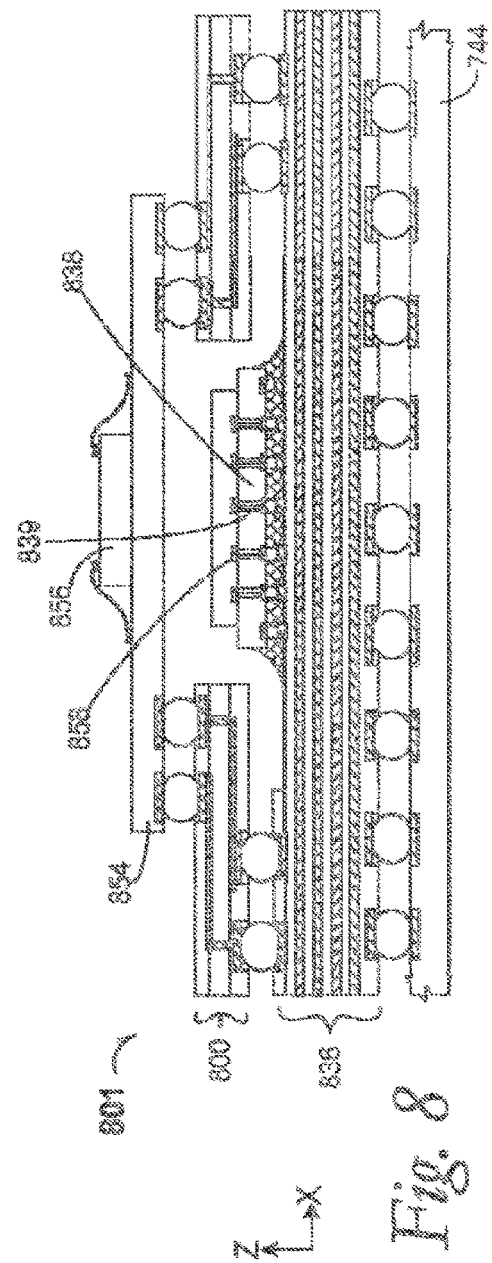

OFFSET INTERPOSERS FOR LARGE-BOTTOM PACKAGES AND LARGE-DIE PACKAGE-ON-PACKAGE STRUCTURES

TECHNICAL FIELD

Disclosed embodiments relate to package-on-package interposers.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 1a is a cross-section elevation of an offset interposer according to an example embodiment;

FIG. 1b is a cross-section elevation of an offset interposer that is disposed on a first-level interconnect according to an example embodiment;

FIG. 2 is a top plan of the offset interposer depicted in FIG. 1a according to an example embodiment;

FIG. 5 is a top plan cutaway of the offset interposer depicted in FIG. 4 according to an example embodiment;

FIG. 6a is a cross-section elevation of a chip package with an offset interposer according to an example embodiment;

FIG. 6b is a cross-section elevation of a chip package with an offset interposer according to an example embodiment;

FIG. 7 is a cross-section elevation of a chip package with an offset interposer according to an example embodiment;

FIG. 8 is a cross-section elevation of a chip package with an offset interposer according to an example embodiment;

DETAILED DESCRIPTION

Figure 3:
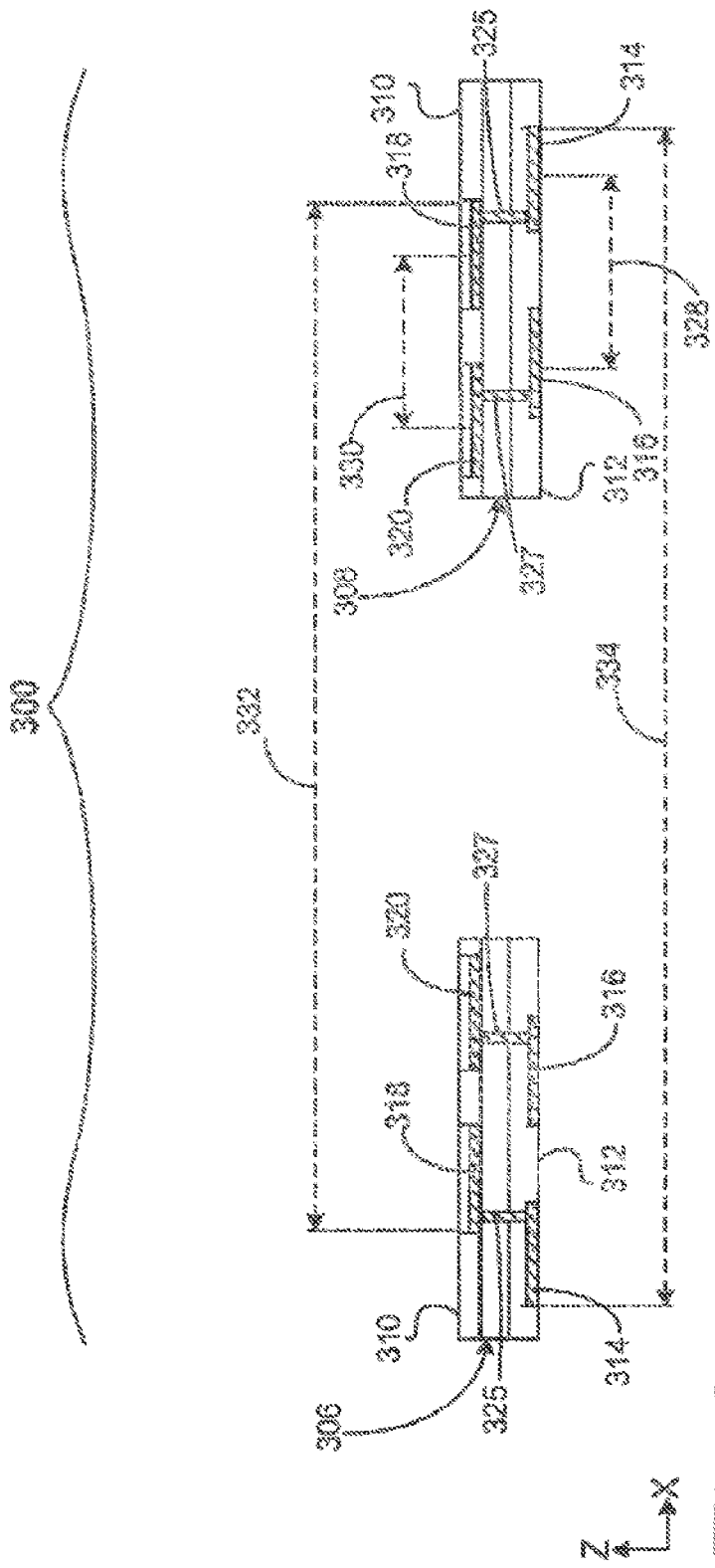
FIG. 3 is a cross-section elevation of an offset interposer according to an example embodiment.

Processes are disclosed where offset interposers are assembled and coupled with microelectronic devices as chip packages. Offset interposer embodiments allow for chip-package designers to decouple interfacing challenges such as between logic devices and memory devices during the packaging process.

Reference will now be made to the drawings wherein like structures may be provided with like suffix reference designations. In order to show the structures of various embodiments more clearly, the drawings included herein are diagrammatic representations of integrated circuit chips assembled to offset interposer embodiments. Thus, the actual appearance of the fabricated chip substrates, alone or in chip packages, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

FIG. 1a is a cross-section elevation of an offset interposer 100 according to an example embodiment. The offset interposer 100 includes a center through hole 108 (also referred to as an inner edge 108) which is provided to allow clearance for a first-level device such as a processor. Similarly, an interposer lateral edge 106 (also referred to as an outer edge 106) defines the outer lateral surface and perimeter of the offset interposer 100.

The offset interposer 100 also includes a land side 112 that is configured to interface with a first-level interconnect such as a package for a processor. Opposite the land side 112 is a package-on-package (POP) side 110 onto which a POP structure such as a memory module is to be assembled.

Two adjacent, spaced-apart land-side pads 114 and 116 (indicated with two occurrences for each side in cross section) are disposed on the land side 112. The land-side pads 114 and 116 are part of a land-side ball-grid array (BGA) that is configured to interface with a first-level interconnect. Similarly, two adjacent spaced-apart POP-side pads 118 and 120 (indicated with two occurrences for each side in cross section) are disposed on the POP side 110. It can be seen that for the two land-side pads 114 and 116, they have a different X-Y orientation than the two POP-side pads 118 and 120 (where the Y-direction is orthogonal to the plane of the FIG). This means the POP-side pads 118 and 120, although they are coupled through the interposer to the respective land-side pads 114 and 116, they are offset or "translated" in at least one of the X- or Y-direction; in these illustrated embodiments, in the X-direction.

A given POP-side pad 118 is coupled to a given land-side pad 114 through a first trace 124 and useful vias 125. Similarly, a given adjacent and spaced-apart POP-side pad 120 is coupled to a corresponding given land-side pad 116 through a second trace 126 and useful vias 127.

As indicated on the offset interposer 100 at the right side thereof, a land-side pad spacing 128 and a POP-side pad spacing 130 define the pad center-to-center spacings of the respective sides. In an embodiment, the land-side-pad spacing 128 is configured to match conventional pad spacings that interface conventional first-level ball-grid array (BGA) interconnects. In an embodiment, the POP-side pad spacing 130 is equal to the land-side pad spacing 128. In an embodiment, the POP-side pad spacing 130 is 0.5 mm. In an embodiment, the land-side pad spacing 128 is 0.5 mm. In an embodiment, the POP-side pad spacing 130 is 0.5 mm and the land-side pad spacing 128 is less than 0.5 mm. In an embodiment, the POP-side pad spacing 130 is unity and the land-side pad spacing 128 is less than unity such as 80% of unity. In an embodiment, the POP-side pad spacing 130 is 0.5 mm and the land-side pad spacing 128 is 0.4 mm.

The POP-side pads 118 and 120 are offset or translated in the X-direction with respect the land-side pads 114 and 116, respectively. As illustrated, the land-side pads 114 and 116 have a land-side perimeter characteristic dimension 134 and the POP-side pads 118 and 120 have a POP-side perimeter characteristic dimension 132. It is seen in this embodiment, that the land-side perimeter characteristic dimension 134 is larger than the POP-side perimeter characteristic dimension 132. When observed in plan view (see FIG. 2), the POP-side pads are arrayed with a perimeter that is less than but concentric with the perimeter of the land-side pads.

In an embodiment, offset of the POP-side pads 118 and 120 is such that the POP-side perimeter characteristic dimension 132 is less than that of the land-side perimeter characteristic dimension 134 such that the X-length of the traces 124 and 126 is less than that depicted in FIG. 1a. In an embodiment, offset of the POP-side pads 118 and 120 is such that the POP-side perimeter characteristic dimension 132 is less than that of the land-side perimeter characteristic dimension 134 such that the traces 124 and 126 depicted in FIG. 1a are not needed. For example, where the trace 124 is not needed, the footprint of the POP-side pad 118 overlaps the footprint of the land-side pad 114. The via 125 interconnects the two respective pads 118 and 114 by direct contact through the interposer 100 (see FIG. 3). In other words, the POP-side pad 118 has a different footprint that its corresponding land-side pad 114. Similarly for example, where the trace 126 is not needed, the footprint of the POP-side pad 120 overlaps the footprint of the land-side pad 116 and the via 127 interconnects the two respective pads 120 and 116 by direct contact through the interposer 100.

FIG. 2 is a top plan of the offset interposer 100 depicted in FIG. 1a according to an example embodiment. Two occurrences each of the spaced-apart but adjacent land-side pads 114 and 116 are indicated with phantom lines as they are below the POP side 110 in a POP-side land-grid array (LGA). Similarly, two occurrences each of two spaced-apart but adjacent POP-side pads 118 and 120 are indicated disposed on the POP side 110 in a land-side BGA.

As seen at the cross-section line 1a, the POP-side pads 118 and 120 are offset in the X-direction with respect to the land-side pads 114 and 116, respectively. As illustrated, the land-side pads 114 and 116 have the land-side perimeter characteristic dimension 134 and the POP-side pads 118 and 120 have the POP-side perimeter characteristic dimension 132. It is seen in this embodiment, that the land-side perimeter characteristic dimension 134 is larger than the POP-side perimeter characteristic dimension 134. It is also seen that no footprint overlap of the POP-side pads 118 and 120 occurs with the land-side pads 114 and 116. In an embodiment however, some footprint overlap of the POP-side pads 118 and 120 occurs with the land-side pads 114 and 116. (See FIG. 3).

Because there may be a one-to-one correspondence between POP-side pads that are coupled to land-side pads, several dummy land-side pads may be present that may be used, however, for increased thermal and physical shock bolstering as well as for extra power and/or ground current flow. As an illustrated embodiment, 56 POP-side pads are depicted on the POP side 110, but where center-to-center pitch and pad size are matched between the POP side 110 and the land side 112, as many as 88 land-side pads are located on the land side 112.

FIG. 1b is a cross-section elevation of a chip package 101 with an offset interposer 100 according to an example embodiment. The offset interposer 100 illustrated in FIG. 1a is depicted mounted upon a first-level interconnect 136 such as a mounting substrate for an electronic device 138. The first-level interconnect 136 may be referred to as a large-bottom package since the POP-side perimeter characteristic dimension 132 is smaller than the land-side characteristic dimension 134.

In an embodiment, the electronic device 138 is a processor such as one manufactured by Intel Corporation of Santa Clara, Calif. In an embodiment, the processor is an Atom® processor. In an embodiment, the processor is the type from Intel Corporation that is code-named Penwell™. The electronic device 138 is mounted flip-chip fashion upon the first-level interconnect 136 and it has an active surface 140 and a backside surface 142. Other configurations of a chip upon the first-level interconnect 136 may include a wire-bond chip with the active surface facing away from the first-level interconnect 136. The first-level interconnect 136 is also configured to communicate to a foundation substrate 144 such as a smartphone motherboard, though an electrical array such as a ball-grid array that is illustrated with several electrical bumps 146. Other ways to connect the first-level interconnect include a land-grid array in the place of electrical bumps.

The offset interposer 100 is coupled to the first-level interconnect 136 by a series of electrical humps 115 and 117 that correspond to the land-side pads 114 and 116 depicted in FIGS. 1a and 2. The electrical bumps 115 and 117 are disposed on the land-side 112. Similarly, a series of electrical bumps 119 and 121 are disposed on the POP-side 110. The series of electrical bumps 119 and 121 correspond to the POP-side pads 118 and 120, respectively, depicted in FIGS. 1a and 2. The series of electrical humps 119 and 121 are POP-side interconnects. The electrical bumps 119 and 121 are depicted for illustrative purposes as they would likely be part of a POP package such that the POP-side pads 118 and 120 are part of a POP LGA.

Because of the translated effect of the offset interposer 100, a useful keep-out zone (KOZ) 150 for underfill material 152 may be maintained, and a larger logic die 138, has a useful underfill amount while the series of humps 115 and 117 remains protected from contamination by the underfill material 152.

In an embodiment, the chip package 101 is assembled to a computing system that has a smartphone form factor. In an embodiment, the chip package 101 is assembled to a computing system that has a tablet form factor.

FIG. 3 is a cross-section elevation of an offset interposer 300 according to an example embodiment. The offset interposer 300 includes a center through hole 308 which is provided to allow clearance for a first-level device such as a processor. Similarly, an interposer lateral edge 306 defines the outer lateral surface of the offset interposer 300. The offset interposer 300 also includes a land side 312 that is configured to interface with a first-level interconnect such as a package for a processor. Opposite the land side 312 is a POP side 310.

Two adjacent, spaced-apart land-side pads 314 and 316 are disposed on the land side 312. Similarly, two adjacent spaced-apart POP-side pads 318 and 320 are disposed on the POP side 310. A given POP-side pad 318 is coupled to a given land-side pad 314 through a useful vias 325. Similarly, a given adjacent and spaced-apart POP-side pad 320 is coupled to a corresponding given land-side pad 316 through useful vias 327.

As indicated on the offset interposer 300 at the right side thereof, a land-side pad spacing 328 and a POP-side pad spacing 330 define the center-to-center pad spacings of the respective sides. In an embodiment, the land-side-pad spacing 328 is configured to match conventional pad spacings that interface conventional first-level interconnects. In an embodiment, the POP-side pad spacing 330 is equal to the land-side pad spacing 328. In an embodiment, the POP-side pad spacing 330 is 0.5 mm. In an embodiment, the land-side pad spacing 328 is 0.5 mm. In an embodiment, the POP-side pad spacing 330 is 0.5 mm and the land-side pad spacing 328 is less than 0.5 mm. In an embodiment, the POP-side pad spacing 330 is unity and the land-side pad spacing 328 is less than unity such as 80% of unity. In an embodiment, the POP-side pad spacing 330 is 0.5 mm and the land-side pad spacing 328 is 0.4 mm.

The POP-side pads 318 and 320 are offset or translated in the X-direction respect to the land-side pads 314 and 316, respectively. As illustrated, the land-side pads 314 and 316 have a land-side perimeter characteristic dimension 334 and the POP-side pads 318 and 320 have a POP-side perimeter characteristic dimension 332. It is seen in this embodiment, that the land-side perimeter characteristic dimension 334 is larger than the POP-side perimeter characteristic dimension 334. When observed in plan view, the POP-side pads are arrayed with a perimeter that is less than but concentric with the perimeter of the land-side pads.

As illustrated according to an embodiment, offset of the POP-side pads 318 and 320 is such that the POP-side perimeter characteristic dimension 332 is less than that of the land-side perimeter characteristic dimension 334 such that the traces 124 and 126 depicted in FIG. 1a are not needed. For example, the footprint of the POP-side pad 318 overlaps (in the X-direction when projected in the Z-direction) the footprint of the land-side pad 314 and the via 325 interconnects the two respective pads 318 and 314 by direct contact. Similarly for example, the footprint of the POP-side pad 320 overlaps the footprint of the land-side pad 316 and the via 327 interconnects the two respective pads 320 and 318 by direct contact. In an embodiment, overlap of the POP-side pad by the land-side pad is 100 percent. In an embodiment, overlap of the POP-side pad by the land-side pad is in a range from 1 percent to less than 100 percent. In an embodiment, overlap of the POP-side pad by the land-side pad is less than 50 percent. This embodiment is illustrated in FIG. 3. In an embodiment, overlap of the POP-side pad by the land-side pad is greater than 50 percent. It may now be appreciated that one embodiment includes the X-Y footprint of the POP-side pads 114 and 116 is exclusive of the X-Y footprint projection of the two corresponding land-side pads 118 and 120. This means there is no overlap of the X-Y footprint of any POP-side pad with its land-side pad projection. This embodiment may be seen illustrated in FIG. 1a and FIG. 2.

It may now be appreciated that the perimeter that is defined by the POP-side perimeter characteristic dimension 132 is closer to the inner edge 108 than the perimeter that is defined by the land-side perimeter characteristic dimension 134. As illustrated, the land-side perimeter characteristic dimension 134 is closer to the outer edge 106 than the POP-side perimeter characteristic dimension 132. In an embodiment, the two characteristic dimensions 132 and 134 are the same. In all other embodiments, the land-side perimeter characteristic dimension 134 is closer to the outer edge 106 and the POP-side perimeter characteristic dimension 132 is closer to the inner edge 108.

Figure 4:
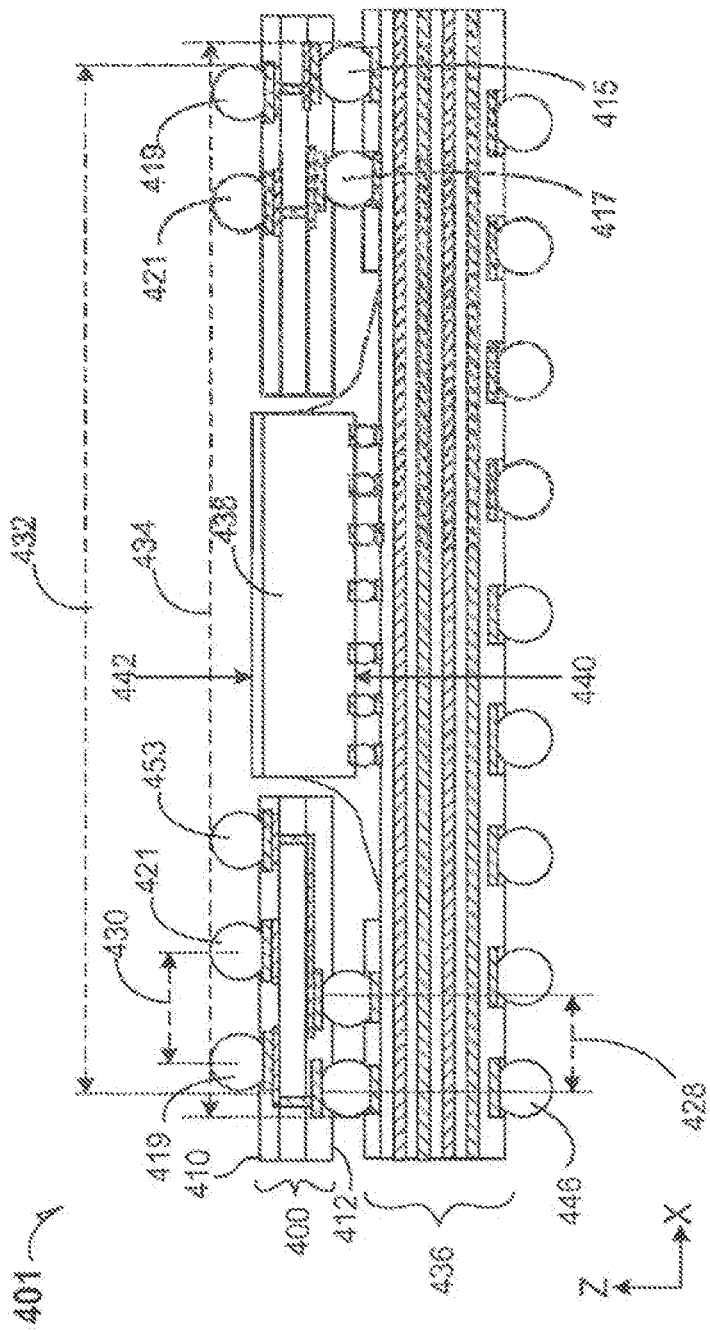
FIG. 4 is a cross-section elevation of a chip package with an offset interposer according to an example embodiment.

FIG. 4 is a cross-section elevation of a chip package 401 with an offset interposer 400 according to an example embodiment. In an embodiment, the chip package 401 is assembled to a computing system that has a tablet form factor. In an embodiment, the chip package 401 is assembled to a computing system that has a smartphone form factor.

The offset interposer 400 illustrated in FIG. 4 is depicted mounted upon a first-level interconnect 436 such as a mounting substrate for an electronic device 438. The electronic device 438 is mounted flip-chip fashion upon the first-level interconnect 436 and it has an active surface 440 and a backside surface 442. Other configurations of a chip upon the first-level interconnect 436 may include a wire-bond chip with the active surface facing away from the first-level interconnect 436. The first-level interconnect 436 is also configured to communicate to a foundation substrate such as the foundation substrate 144 depicted in FIG. 1a. The foundation substrate may be a tablet motherboard that is communicated to by an electrical array such as a ball-grid array that is illustrated with several electrical bumps 446.

The offset interposer 400 is coupled to the first-level interconnect 436 by a series of electrical humps 415 and 417 that correspond to land-side pads on the land-side surface 410. The electrical bumps 415 and 417 are disposed on the land-side 412. Similarly, a series of electrical bumps 419, 421, and 453 are disposed on the POP-side 410. The electrical humps 419, 421, and 453 are depicted for illustrative purposes as they would likely be part of a POP package such that the POP-side pads (such as the POP-side pads 118 and 120, depicted in FIG. 1a) are part of a POP LGA.

At the left side of the cross section, three electrical bumps 419, 421, and 453 are seen, but on the right side thereof, only two electrical humps 419 and 421 are seen in this cross section according to an embodiment. Further to the illustrated embodiment, POP-side pad spacing 430 is greater than land-side pad spacing 428. The bump count may be the same on both the land-side 412 and the POP-side 410, however, by virtue of the smaller land-side spacing 428, which allows a denser bump array on the land-side 412 than that on the POP-side 410. In an example embodiment, the bump count is the same on the POP side 410 as on the land-side 412. In an example embodiment, the bump count on the land-side 412 is 88 and it is the same on the POP side 410 as on the land-side 412.

In an embodiment, the POP-side bumps 419, 421, and 453 accommodate a POP package (not pictured, see, e.g., FIGS. 6, 7, and 8) that has the same X-Y dimensions as the offset interposer 400. The difference, however, is the electrically connected POP-side bumps 419, 421, and 453 on the POP side 410 are set at a larger pitch than the electrically connected land-side bumps 415 and 417.

As indicated on the offset interposer 400 at the left side thereof, a land-side pad spacing 428 and a POP-side pad spacing 430 define the pad spacings of the respective sides, in an embodiment, the POP-side pad spacing 430 is 0.5 mm and the land-side pad spacing 428 is 0.4 mm. Other comparative POP- to land-side pad spacing embodiments set forth in this disclosure may be applied to the illustration.

In an embodiment, the land-side-pad spacing 428 is configured to match conventional pad spacings that interface conventional first-level interconnects. In an embodiment, the POP-side pad spacing 430 is equal to the land-side pad spacing 428. In an embodiment, the POP-side pad spacing 430 is 0.5 mm. In an embodiment, the land-side pad spacing 428 is 0.5 mm. In an embodiment, the POP-side pad spacing 430 is 0.5 mm and the land-side pad spacing 428 is less than 0.5 mm. In an embodiment, the POP-side pad spacing 430 is unity and the land-side pad spacing 428 is less than unity such as 80% of unity.

It may now be appreciated that the offset interposer 400 may have land-side pads that accommodate a two-bump row of electrical connections, but the POP-side pads accommodate a three-bump row of electrical connections. In an example embodiment, a memory module that is to be mounted onto the POP bumps 419, 421, and 453 is accommodated and adapted to a larger logic die 438 by using a tighter-pitch array of land-side humps 415 and 417 that is configured as a two-bump row of electrical connections. In an embodiment, the chip package 401 is assembled to a computing system that has a tablet form factor.

FIG. 5 is a top plan cutaway 500 of the offset interposer 400 depicted in FIG. 4 according to an example embodiment. The offset interposer 400 depicted in FIG. 4 is illustrated at the section line 4. It can be seen when sighting from left-to-right along the X-direction that the series of electrical bumps 419, 421, and 453 on the left side is intermingled as a row of three bumps positioned between alternating rows of two bumps. Similarly on the right side, a series of electrical bumps 419 and 421 is intermingled as a row of two bumps positioned between alternating rows of three bumps according to an embodiment. In an embodiment, the two-bump row, three-bump row configuration may be mixed and matched. It is seen that in the bottom right, two three-bump rows are spaced apart and adjacent to each other.

As illustrated, the series of electrical bumps 419, 421, 453 (and continuing from left-to-right) 421 and 419 help to define the POP-side perimeter characteristic dimension 432.

FIG. 6a is a cross-section elevation of a chip package 601 with an offset interposer 600 according to an example embodiment. The offset interposer 600 illustrated in FIG. 6 is depicted mounted upon a first-level interconnect 636 such as a mounting substrate for an electronic device 638. The first-level interconnect 636 is also depicted mounted upon a foundation substrate 644 according to any of the embodiments set forth in this disclosure. The electronic device 638 is mounted flip-chip fashion upon the first-level interconnect 636.

A POP substrate 654 is mounted on electrical bumps that are on the POP side of the offset interposer 600. The POP substrate 654 is depicted with a POP device 658 such as a memory die 656.

It may now be appreciated that the offset interposer 600 may have land-side pads that accommodate, e.g., a 12×12 mm landing onto the first-level interconnect 636 and the POP-side pads accommodate a POP substrate 654 that is smaller than the 12×12 size example. Thus, where the footprint of the offset interposer 600 onto the first-level interconnect 636 is, e.g., 12×12 mm, and where the POP device 656 is smaller, the offset interposer 600 accommodates the smaller size of the POP device 656 without disrupting what may be a useful 12×12 mm size of the footprint of the interposer 600 upon the first-level interconnect 636.

It may now be appreciated that the offset interposer 600 may have land-side pads that accommodate, e.g., a 14×14 mm landing that is needed for a given electronic device 638, while the landing size onto the first-level interconnect 636 is needed to be 14×14 mm, the POP-side pads accommodate a POP substrate 654 that is smaller but perhaps a useful, e.g., 12×12 mm footprint. In an example embodiment, a larger processor 638 is needed but a POP substrate 654 has a 12×12 mm footprint onto the offset interposer 600. It may now be appreciated that all comparative pad spacing embodiments may be applied to the illustration.

FIG. 6b is a cross-section elevation of a chip package 603 with an offset interposer 400 according to an example embodiment. The offset interposer 400 illustrated in FIG. 6 is depicted mounted upon a first-level interconnect 636 such as a mounting substrate for an electronic device 638. The first-level interconnect 636 is also depicted mounted upon a foundation substrate 644 according to any of the embodiments set forth in this disclosure. The electronic device 638 is mounted flip-chip fashion upon the first-level interconnect 636.

A POP substrate 654 is mounted on electrical bumps that are on the POP side of the offset interposer 600. The POP substrate 654 is depicted with a POP device 658 such as a memory die 656.

It may now be appreciated that the offset interposer 400 and the POP substrate 654 may have similar X-Y form factors. It may now be appreciated that all comparative pad spacing embodiments may be applied to the illustration.

FIG. 7 is a cross-section elevation of a chip package 701 with an offset interposer 700 according to an example embodiment. The offset interposer 700 illustrated in FIG. 7 is depicted mounted upon a first-level interconnect 736 such as a mounting substrate for an electronic device 738. The first-level interconnect 736 is also depicted mounted upon a foundation substrate 744 according to any of the embodiments set forth in this disclosure. The electronic device 738 is mounted flip-chip fashion upon the first-level interconnect 736. A stacked die 758 is mounted on the electronic device 738 according to an embodiment. The stacked die 758 is a wire-bonded device that is in electrical communication with other devices through the first-level interconnect 736 depicted in the chip package 701.

A POP substrate 754 is mounted on electrical bumps that are on the POP side of the offset interposer 700, The POP substrate 754 is depicted with a POP device such as a memory die 756. In an embodiment, the stacked die 758 is a radio frequency (RE) die and the POP device 756 is a memory die.

It may now be appreciated that the offset interposer 700 may have land-side pads that accommodate, e.g., a 12×12 mm landing onto the first-level interconnect 736 and the POP-side pads accommodate a POP substrate 754 that is smaller than the 12×12 size example, but sufficient clearance is provided between the first-level interconnect 636 and the POP substrate 754 to accommodate both the electronic device 738 and the stacked die 758. Thus, where the footprint of the offset interposer 700 onto the first-level interconnect 736 is, e.g., 12×12 mm, and where the POP device 756 is smaller, the offset interposer 700 accommodates the smaller size of the POP device 756 without disrupting what may be a useful size of the footprint of the interposer 700 upon the first-level interconnect 736.

It may now be appreciated that the offset interposer 700 may have land-side pads that accommodate, e.g., a 14×14 mm landing that is needed for a given electronic device 738, while the landing size onto the first-level interconnect 736 is needed to be 14×14 mm, the POP-side pads accommodate a POP substrate 754 that is smaller but perhaps a useful 12×12 mm footprint In an example embodiment, a larger processor 738 is needed but a POP substrate 754 has a 12×12 mm footprint onto the offset interposer 700. It may now be appreciated that all comparative pad spacing embodiments may be applied to the illustration.

It may now be appreciated that an offset interposer such as the offset interposer 400 depicted in FIG. 4 may be used in FIG. 7 in the place of the offset interposer 700, where a three-ball-count row configuration is translated from the POP side to a two-ball-court row configuration on the land-side.

FIG. 8 is a cross-section elevation of a chip package 801 with an offset interposer 800 according to an example embodiment. The offset interposer 800 illustrated in FIG. 8 is depicted mounted upon a first-level interconnect 836 such as a mounting substrate for an electronic device 838. The first-level interconnect 836 is also depicted mounted upon a foundation substrate 844 according to any of the embodiments set forth in this disclosure. The electronic device 838 is mounted flip-chip fashion upon the first-level interconnect 836. The electronic device 838 is depicted as a through-silicon (through the die) via (TSV) 839 device 838 and a stacked die 858 is mounted flip-chip fashion on the TSV electronic device 838 according to an embodiment. The stacked die 854 is a flip-chip device that is in electrical communication with other devices through the first-level interconnect 836 by the TSVs 839 depicted in the chip package 801.

A POP substrate 854 is mounted on electrical bumps that are on the POP side of the offset interposer 800. The POP substrate 854 is depicted with a POP device such as a memory die 856. In an embodiment, the stacked device 858 is a memory die and the POP device 856 is wire-bonded RF device 856.

It may now be appreciated that the offset interposer 800 may have land-side pads that accommodate, e.g., a 12×12 mm landing onto the first-level interconnect 836 and the POP-side pads accommodate a POP substrate 854 that is smaller than the 12×12 size example, but sufficient clearance is provided between the first-level interconnect 836 and the POP substrate 854 to accommodate both the TSV electronic device 838 and the stacked die 858. Thus, where the footprint of the offset interposer 800 onto the first-level interconnect 836 is, e.g., 12×12 mm, and where the POP device 856 is smaller, the offset interposer 800 accommodates the smaller size of the POP device 856 without disrupting what may be a useful size of the footprint of the interposer 800 upon the first-level interconnect 836.

It may now be appreciated that the offset interposer 800 may have land-side pads that accommodate, e.g., a 14×14 mm landing that is needed for a given TSV electronic device 838, while the landing size onto the first-level interconnect 836 is needed to be 14×14 mm, the POP-side pads accommodate a POP substrate 854 that is smaller but perhaps a useful 12×12 mm footprint. In an example embodiment, a larger TSV processor 838 is needed but a POP substrate 854 has a 12×12 mm footprint onto the offset interposer 800. It may now be appreciated that all comparative pad spacing embodiments may be applied to the illustration.

It may now be appreciated that an offset interposer such as the offset interposer 400 depicted in FIG. 4 may be used in FIG. 8 in the place of the offset interposer 800, where a three-ball-count row configuration is translated from the POP side to a two-ball-count row configuration on the land-side.

Figure 9:
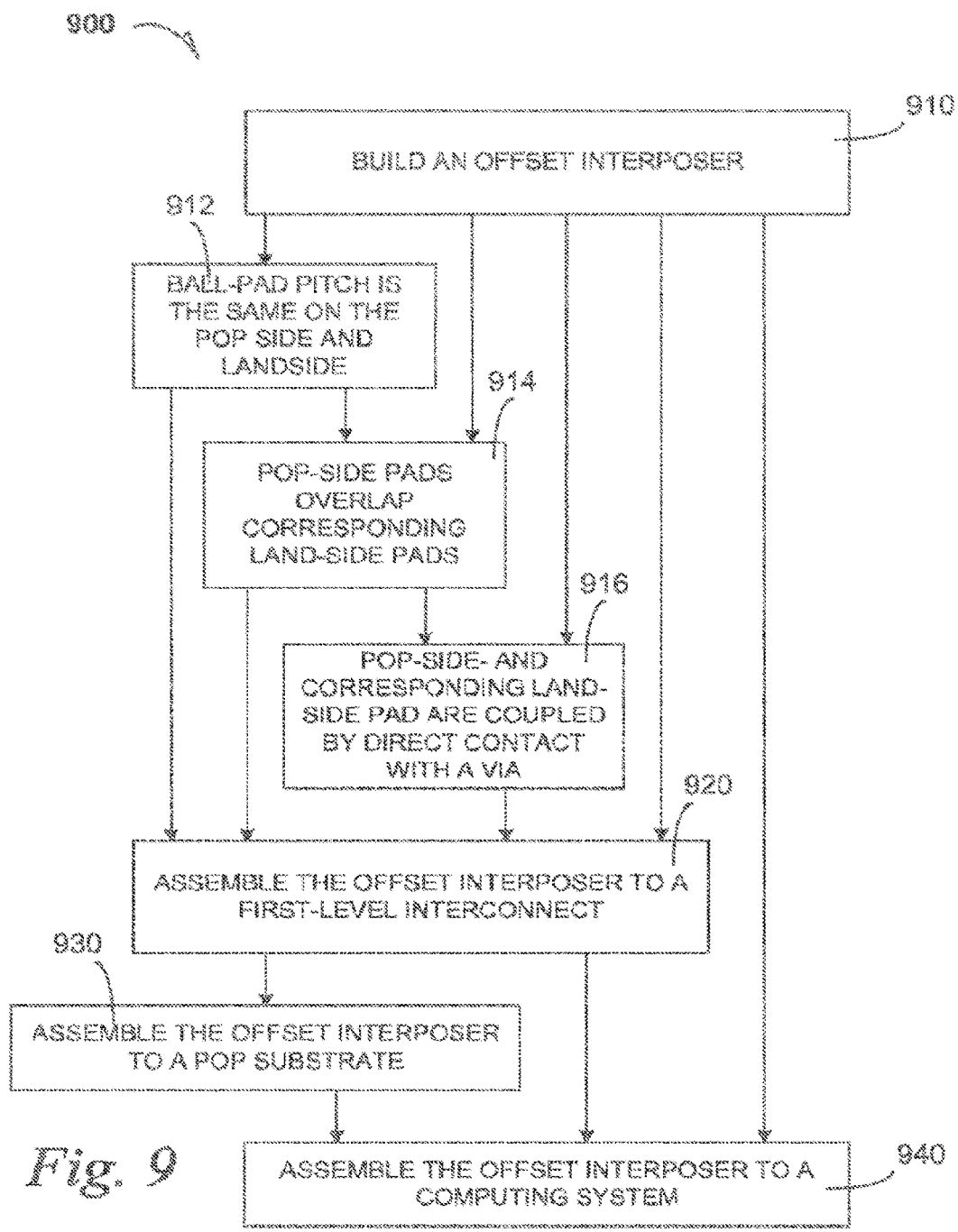
FIG. 9 is a process and method flow diagram according to an example embodiment.

FIG. 9 is a process and method flow diagram according to example embodiments.

At 910, a process embodiment includes forming an offset interposer. An offset interposer may be built by known technique to achieve the several disclosed embodiment. For example, formation of an offset interposer includes laminating traces and BGA pads onto a core with a useful configuration of translated pads when comparing POP side pad placement to land-side pad placement.

At 912, an embodiment of building the offset interposer includes making the ball-pad pitch on the POP side the same as that on the land side. It may now be understood that ball-pad pitch may be different on one side compared to the other side.

At 914, an embodiment of building the offset interposer includes making the POP-side pads overlap the landside pads. In an non-limiting example embodiment, the POP-side pads 318 and 320 overlap their corresponding land-side pads 314 and 316, respectively.

At 915, an embodiment of building the offset interposer includes coupling the POP-side pad with its corresponding land-side pad by direct contact only with a via.

At 920, a method of assembling an offset interposer to a first-level interconnect includes mating the land-side of pads to electrical bumps that are disposed on a first-level interconnect.

At 930, a method embodiment includes assembling the offset interposer to a POP substrate.

At 940, a method embodiment includes assembling the offset interposer to a computing system.

Figure 10:
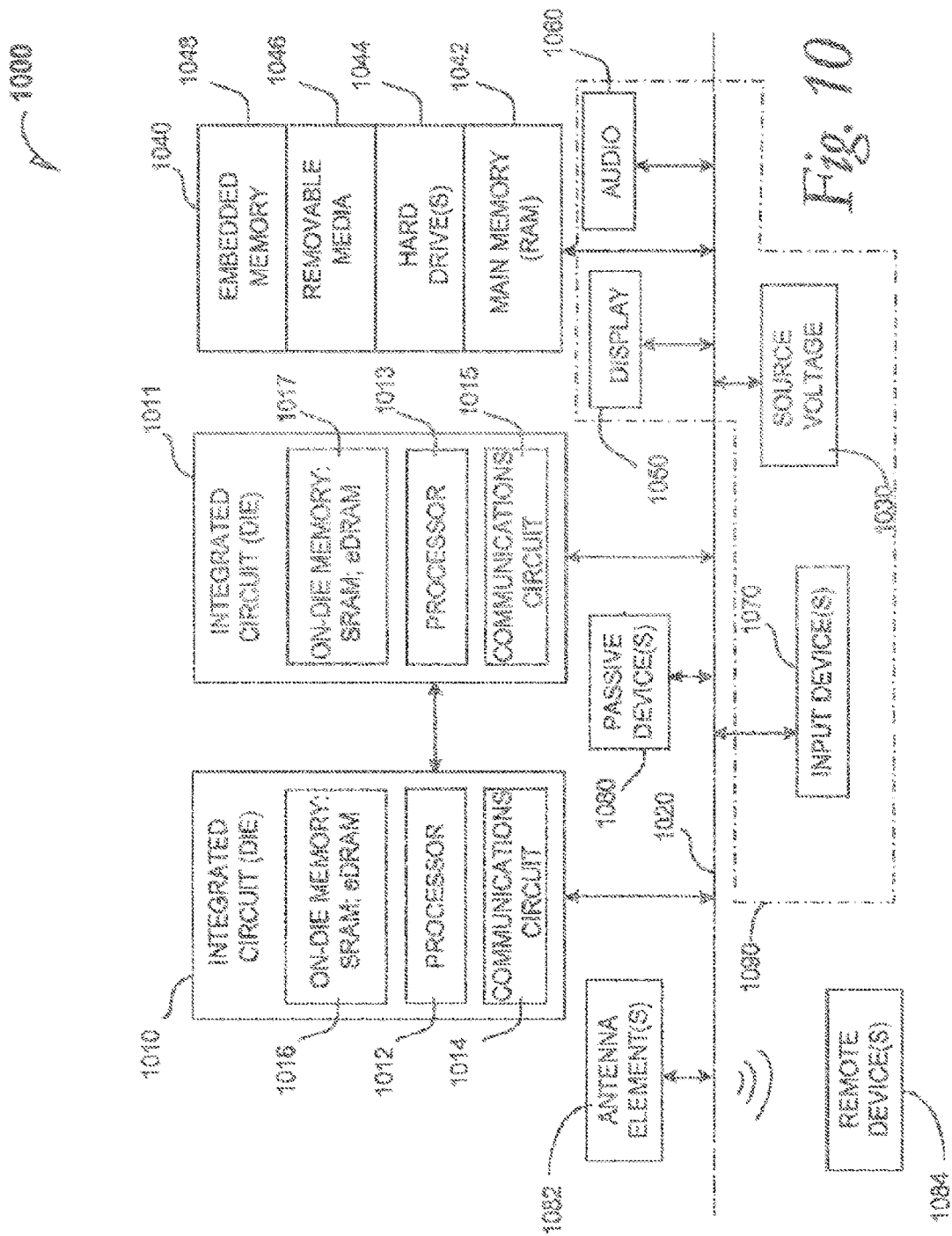
FIG. 10 is a schematic of a computer system according to example embodiments.

FIG. 10 is a schematic of a computer system according to an embodiment. The computer system 1000 (also referred to as the electronic system 1000) as depicted can embody an offset interposer according to any of the several disclosed embodiments and their equivalents as set forth in this disclosure. An apparatus that includes an offset interposer that is assembled to a computer system. The computer system 1000 may be a smartphone. The computer system 1000 may be a tablet computer. The computer system 1000 may be a mobile device such as a netbook computer. The computer system 1000 may be a desktop computer. The computer system 1000 may be integral to an automobile. The computer system 1000 may be integral to a television. The computer system 1000 may be integral to a DVD player. The computer system 1000 may be integral to a digital camcorder.

In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to an integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type of an apparatus that includes an offset interposer embodiment. As used herein, the processor 1012 may mean any type of circuit such as, but not limited to, a microprocessor, a microcontroller, a graphics processor, a digital signal processor, or another processor. In an embodiment, SRAM embodiments are found in memory caches of the processor 1012. Other types of circuits that can be included in the integrated circuit 1010 are a custom circuit or an application-specific integrated circuit (ASIC), such as a communications circuit 1014 for use in non-equivalent wireless devices such as cellular telephones, smartphones, pagers, portable computers, two-way radios, and other electronic systems. In an embodiment, the processor 1010 includes on-die memory 1016 such as static random-access memory (SRAM). In an embodiment, the processor 1010 includes embedded on-die memory 1016 such as embedded dynamic random-access memory (eDRAM).

In an embodiment, the integrated circuit 1010 is complemented with a subsequent integrated circuit 1011 such as a graphics processor or a radio-frequency integrated circuit or both as set forth in this disclosure. In an embodiment, the dual integrated circuit 1010 includes embedded on-die memory 1017 such as eDRAM. The dual integrated circuit 1011 includes an RFIC dual processor 1013 and a dual communications circuit 1015 and dual on-die memory 1017 such as SRAM. In an embodiment, the dual communications circuit 1015 is particularly configured for RF processing.

In an embodiment, at least one passive device 1080 is coupled to the subsequent integrated circuit 1011 such that the integrated circuit 1011 and the at least one passive device are part of the any apparatus embodiment that includes an offset interposer that includes the integrated circuit 1010 and the integrated circuit 1011. In an embodiment, the at least one passive device is a sensor such as an accelerometer for a tablet or smartphone.

In an embodiment, the electronic system 1000 includes an antenna element 1082 such as any coreless pin-grid array substrate embodiment set forth in this disclosure. By use of the antenna element 1082, a remote device 1084 such as a television, may be operated remotely through a wireless link by an apparatus embodiment. For example, an application on a smart telephone that operates through a wireless link broadcasts instructions to a television up to about 30 meters distant such as by Bluetooth® technology. In an embodiment, the remote device(s) includes a global positioning system of satellites for which the antenna element(s) are configured as receivers.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. In an embodiment, the external memory 1040 is part of a POP package that is stacked upon an offset interposer according to any disclosed embodiments. In an embodiment, the external memory 1040 is embedded memory 1048 such an apparatus that includes an offset interposer mated to both a first-level interconnect and to a POP memory module substrate according to any disclosed embodiment.

In an embodiment, the electronic system 1000 also includes a display device 1050, and an audio output 1060. In an embodiment, the electronic system 1000 includes an input device such as a controller 1070 that may be a keyboard, mouse, touch pad, keypad, trackball, game controller, microphone, voice-recognition device, or any other input device that inputs information into the electronic system 1000. In an embodiment, an input device 1070 includes a camera. In an embodiment, an input device 1070 includes a digital sound recorder. In an embodiment, an input device 1070 includes a camera and a digital sound recorder.

A foundation substrate 1090 may be part of the computing system 1000. In an embodiment, the foundation substrate 1090 is a motherboard that supports an apparatus that includes an offset interposer. In an embodiment, the foundation substrate 1090 is a board which supports an apparatus that includes an offset interposer. In an embodiment, the foundation substrate 1090 incorporates at least one of the functionalities encompassed within the dashed line 1090 and is a substrate such as the user shell of a wireless communicator.

As shown herein, the integrated circuit 1010 can be implemented in a number of different embodiments, an apparatus that includes an offset interposer according to any of the several disclosed embodiments and their equivalents, an electronic system, a computer system, one or more methods of fabricating an integrated circuit, and one or more methods of fabricating and assembling an apparatus that includes an offset interposer according to any of the several disclosed embodiments as set forth herein in the various embodiments and their art-recognized equivalents. The elements, materials, geometries, dimensions, and sequence of operations can all be varied to suit particular I/O coupling requirements including offset interposer embodiments and their equivalents.

Although a die may refer to a processor chip, an RF chip, an RFIC chip, IPD chip, or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. § 1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An interposer, comprising:
    a land side including land-side ball-grid array (BGA) including land-side pads, wherein the land-side BOA is configured to interface with a first-level interconnect; and
    a package-on-package (POP) side including a POP-side BOA including POP-side pads,
    wherein the POP-side BOA is configured to interface with a POP interconnect, wherein the land-side pads are coupled to the POP-side pads through the interposer,
    wherein the land-side pads have a different footprint than the respective POP-side pads,
    wherein the land side pads are configured at a first pitch and the POP-side pads are configured at a second pitch
    wherein the land-side pads have a first perimeter dimension and the POP-side pads have a second perimeter dimension, wherein the first perimeter dimension is larger than the second perimeter dimension, and
    wherein the POP-side pads include a first set of POP-side pads located on a first side of an interposer through hole and a second set of POP-side pads located on a second side of the interposer through hole, and along a first cross-section of the interposer, a number of pads in the first set of POP-side pads is greater than a number of pads in the second set of POP-side pads.

2. The interposer of claim 1, wherein a given land-side pad is coupled to the corresponding POP-side pad by direct contact with a via.

3. The interposer of claim 1, wherein along a second cross section of the interposer, the number of pads in the first set of POP-side pads is less than the number of in the second set of POP-side pads.

4. The interposer of claim 1, wherein the different footprint of the land-side pads is exclusive of the footprint of the POP-side pads, and wherein the first pitch is smaller than the second pitch.

5. The interposer of claim 1, wherein the different footprint of the land-side pads is a less than 50 percent overlap.

6. The interposer of claim 1, wherein the different footprint of the land-side pads is a less than 50 percent overlap, and wherein a given land-side pad is coupled to the corresponding POP-side pad by direct contact with a via.

7. The interposer of claim 1, wherein the different footprint of the land-side pads is a less than 50 percent overlap, wherein the land-side pads are configured at a first pitch, wherein the POP-side pads are configured at a second pitch, and wherein the first pitch is smaller than the second pitch.

8. The interposer of claim 1, wherein the land-side pads are part of an array of land-side pads that are all configured at the first pitch, wherein the POP-side pads are part of an array of POP-side pads that are all configured at the second pitch, and wherein the first pitch is smaller than the second pitch.

9. The interposer of claim 1, wherein the first pitch is the same as the second pitch.

10. The interposer of claim 1, wherein the second pitch is on 0.5 mm centers and the first pitch is on 0.4 mm centers.

11. A package-on-package (POP) chip package comprising:
An offset interposer including:
a land side including land-side ball-grid array (BGA) including land-side pads, wherein the land-side BGA is configured to interface with a first-level interconnect; and
a package-on-package (POP) side including a POP-side BGA including POP-side pads,
wherein the POP-side BGA is configured to interface with a POP interconnect,
wherein the land-side pads are coupled to the POP-side pads through the interposer
wherein the land-side pads each have a different footprint than the respective POP-side pads, and wherein the land side pads are configured at a first pitch and the POP-side pads are configured at a second pitch,
wherein the land-side pads have a first perimeter dimension and the POP-side pads have a second perimeter dimension, wherein the first perimeter dimension is larger than the second perimeter dimension, and
wherein the POP-side pads include a first set of POP-side pads located on a first side of an interposer through hole and a second set of POP-side pads located on a second side of the interposer through hole, and along a first cross-section of the interposer, a number of pads in the first set of POP-side pads is greater than a number of pads in the second set of POP-side pads;
a POP substrate coupled to POP interconnects on the POP-side BGA; and a microelectronic device disposed on the POP substrate, wherein the microelectronic device is electrically coupled to the offset interposer through the POP substrate.

12. The POP chip package 11, wherein a given land-side pad is coupled to corresponding POP-side pad by direct contact with a via.

13. The POP chip package of claim 11, wherein the different footprint of the two land-side pads is exclusive of the footprint of the two POP-side pads.

14. The POP chip package of claim 11, wherein the different footprint of the land-side pads is exclusive of the footprint of the POP-side pads, and wherein the first pitch is smaller than the second pitch.

15. The POP chip package of claim 11, wherein the two adjacent; spaced-apart land-side pads are configured at a first pitch, wherein the two adjacent, spaced-apart POP-side pads are configured at a second pitch, further including the die-side BGA is arranged with alternating two- and three-pad occurrences and the land-side BGA is arranged only with two-pad occurrences.

16. The POP chip package of claim 11, wherein the microelectronic device is flip-chip disposed upon the POP substrate.

17. The POP chip package of claim 11, further including:
a first-level interconnect coupled to the land side of the offset interposer; and
an electronic device mounted on the first-level interconnect.

18. The POP chip package of claim 11, further including:
a first-level interconnect coupled to the land side of the offset interposer;
an electronic device mounted on the first-level interconnect; and
a stacked die mounted on the electronic device.

19. The POP chip package of claim 11, further including:
a first-level interconnect coupled to the land side of the offset interposer;
an electronic device mounted on the first-level interconnect; and
a wire-bonded stacked die mounted on the electronic device.

20. The POP chip package of claim 11, further including:
a first-level interconnect coupled to the land side of the offset interposer;
an electronic device mounted on the first-level interconnect; and
a through-silicon via stacked die mounted on the electronic device.

21. A process of building an offset interposer, comprising:
forming a land side including land-side ball-grid array (BGA) including land-side pads; wherein the land-side BGA is configured to interface with a first-level interconnect; and
forming a package-on-package (POP) side including a POP-side BGA including POP-side pads,
wherein the POP-side BGA is configured to interface with a POP interconnect, wherein the land-side pads are coupled to the POP-side pads through the interposer,
wherein the land-side pads have a different footprint than the POP-side pads,
wherein the land side pads are configured at a first pitch and the POP-side pads are configured at a second pitch
wherein the land-side pads have a first perimeter dimension and the POP-side pads have a second perimeter dimension; wherein the first perimeter dimension is larger than the second perimeter dimension wherein the POP-side pads include a first set of POP-side pads located on a first side of an interposer through hole and a second set of POP-side pads located on a second side of the interposer through hole, and along a first cross-section of the interposer, a number of pads in the first set of POP-side pads is greater than a number of pads in the second set of POP-side pads.

22. The process of claim 21, wherein the different footprint of the land-side pads is formed to be exclusive of the footprint of the POP-side pads, and wherein the first pitch is smaller than the second pitch.

23. The process of claim 21, further including a method of assembling the offset interpose to a first-level interconnect.

24. The process of claim 21, further including a method of assembling the offset interposer to a POP substrate.

* * * * *

UNITED STATES PATENT AND TRADEMARK OFFICE
CERTIFICATE OF CORRECTION

PATENT NO. : 10,446,530 B2  
APPLICATION NO. : 13/977101  
DATED : October 15, 2019  
INVENTOR(S) : Mortensen et al.

Page 1 of 1

It is certified that error appears in the above-identified patent and that said Letters Patent is hereby corrected as shown below:

In the Claims

In Column 12, Line 47, in Claim 1, delete "BOA" and insert --BGA-- therefor

In Column 12, Line 51, in Claim 1, delete "BOA" and insert --BGA-- therefor

In Column 12, Line 52, in Claim 1, delete "BOA" and insert --BGA-- therefor

In Column 14, Line 16, in Claim 15, delete "adjacent;" and insert --adjacent,-- therefor In Column 14, Line 52, in Claim 21, delete "pads;" and insert --pads,-- therefor In Column 14, Line 66, in Claim 21, delete "dimension;" and insert --dimension,-- therefor Signed and Sealed this  
Seventh Day of December, 2021

Drew Hirshfeld  
*Performing the Functions and Duties of the*  
*Under Secretary of Commerce for Intellectual Property and*  
*Director of the United States Patent and Trademark Office*